United States Patent
Doshida (10) Patent No.: US 9,147,828 B2
(45) Date of Patent: Sep. 29, 2015

(54) PIEZOELECTRIC DRIVE ELEMENT AND PIEZOELECTRIC DRIVE UNIT

(75) Inventor: Yutaka Doshida, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 301 days.

(21) Appl. No.: 13/876,455

(22) PCT Filed: Apr. 18, 2012

(86) PCT No.: PCT/JP2012/060409
§ 371 (c)(1),
(2), (4) Date: Apr. 17, 2013

(87) PCT Pub. No.: WO2012/160910
PCT Pub. Date: Nov. 29, 2012

(65) Prior Publication Data
US 2013/0207512 A1    Aug. 15, 2013

(30) Foreign Application Priority Data

May 25, 2011    (JP) .................................. 2011-117484

(51) Int. Cl.
*H01L 41/083* (2006.01)
*H01L 41/18* (2006.01)
(Continued)

(52) U.S. Cl.
CPC ............ *H01L 41/083* (2013.01); *H01L 41/183* (2013.01); *H01L 41/273* (2013.01); *H01L 41/37* (2013.01)

(58) Field of Classification Search
CPC ...... H01L 41/083; H01L 41/183; H01L 41/37
USPC .................................... 310/358; 252/62.9 PZ
See application file for complete search history.

(56) References Cited

U.S. PATENT DOCUMENTS 7,264,744 B2 *  9/2007  Nanao et al. ............ 252/62.9 PZ
7,985,348 B2 *  7/2011  Tsukada et al. .......... 252/62.9 R
(Continued)

FOREIGN PATENT DOCUMENTS

CN        101274849 A    10/2008
JP        2002-338355 A   11/2002
(Continued)

OTHER PUBLICATIONS

A Notification of First Office Action with Search Report issued by the State Intellectual Property Office of China, mailed Jul. 24, 2014, for Chinese counterpart application No. 201280002904.7.

(Continued)

*Primary Examiner* — J. San Martin
(74) *Attorney, Agent, or Firm* — Law Office of Katsuhiro Arai (57) ABSTRACT

A piezoelectrically actuated element includes a composite ceramic to which an alternating electric field is applied through external electrodes that are orthogonal to the polarization direction, wherein the composite ceramic is formed from a first piezoelectric ceramic having soft spring characteristics such that the elastic constant decreases with increasing vibration velocity, and a second piezoelectric ceramic having hard spring characteristics such that the elastic constant increases with increasing vibration velocity. Even when the applied electric field is intensified to increase the vibration velocity of the piezoelectrically actuated element, the overall change in the elastic constant is minimized, and fluctuations in the resonance frequency is suppressed.

5 Claims, 7 Drawing Sheets (51) Int. Cl.
*H01L 41/37* (2013.01)
*H01L 41/273* (2013.01)

(56) References Cited

U.S. PATENT DOCUMENTS

| | | | |
|---|---|---|---|
| 2004/0253466 A1 | 12/2004 | Kondo et al. | |
| 2007/0158608 A1 | 7/2007 | Feltz et al. | |
| 2008/0074004 A1* | 3/2008 | Yamamoto et al. | 310/358 |
| 2008/0237531 A1 | 10/2008 | Tsukada et al. | |
| 2008/0284284 A1 | 11/2008 | Kawada et al. | |
| 2009/0302961 A1 | 12/2009 | Ogawa et al. | |
| 2012/0080636 A1* | 4/2012 | Tauchi et al. | 252/62.9 PZ |

FOREIGN PATENT DOCUMENTS

| | | |
|---|---|---|
| JP | 2003-221276 A | 8/2003 |
| JP | 2005-005450 A | 1/2005 |
| JP | 2007-523821 A | 8/2007 |
| JP | 2010-062174 A | 3/2010 |
| WO | 2007/083475 A1 | 7/2007 |
| WO | 2008/090758 A1 | 7/2008 |

OTHER PUBLICATIONS

"Microstructural and Dielectric Properties of Ceramics based on K2Sr4Nb10O30 and BaTiO3" by Renzheng Chen, et al., The Institute of Electrical and Electronics Engineers, Inc., Applications of Ferroelectrics, 2002. ISAF 2002. Proceedings of the 13th IEEE International Symposium on U.S.A. (Jun. 1, 2002), pp. 251-254.

Notification of Reasons for Refusal issued by the Japanese Patent Office, mailed Oct. 8, 2013, for Japanese counterpart application No. 2011-117484.

Notification of Transmittal of Translation of the International Preliminary Report on Patentability (PCT/IB/338) mailed Dec. 5, 2013, with International Preliminary Report on Patentability (PCT/IB/373) and Written Opinion of the International Searching Authority (PCT/ISA/237), for corresponding international application PCT/JP2012/060409.

"Atsuden Zairyo no Shin Tenkai (New Development of Piezoelectric Materials)" by Sadayuki Takahashi, TIC Co., Ltd., New Ceramics vol. 11, No. 8 (1998), pp. 29-34.

"Haipawaa Zairyo no Hyoka (Evaluation of High-power Materials)" by Sadayuki Takahashi, TIC Co., Ltd., New Ceramics (1995), No. 6, pp. 17-21.

\* cited by examiner

PIEZOELECTRIC DRIVE ELEMENT AND PIEZOELECTRIC DRIVE UNIT

This application is the U.S. National Phase under 35 U.S.C. §371 of International Application PCT/JP2012/060409, filed Apr. 18, 2012, which claims priority to Japanese Patent Application No. 2011-117484, filed May 25, 2011. The International Application was published under PCT Article 21(2) in a language other than English.

TECHNICAL FIELD

The present invention relates to a piezoelectric drive element and piezoelectric drive unit, and more specifically to a piezoelectric drive element and piezoelectric drive unit used at and near a resonance frequency.

BACKGROUND ART

Figure 7:
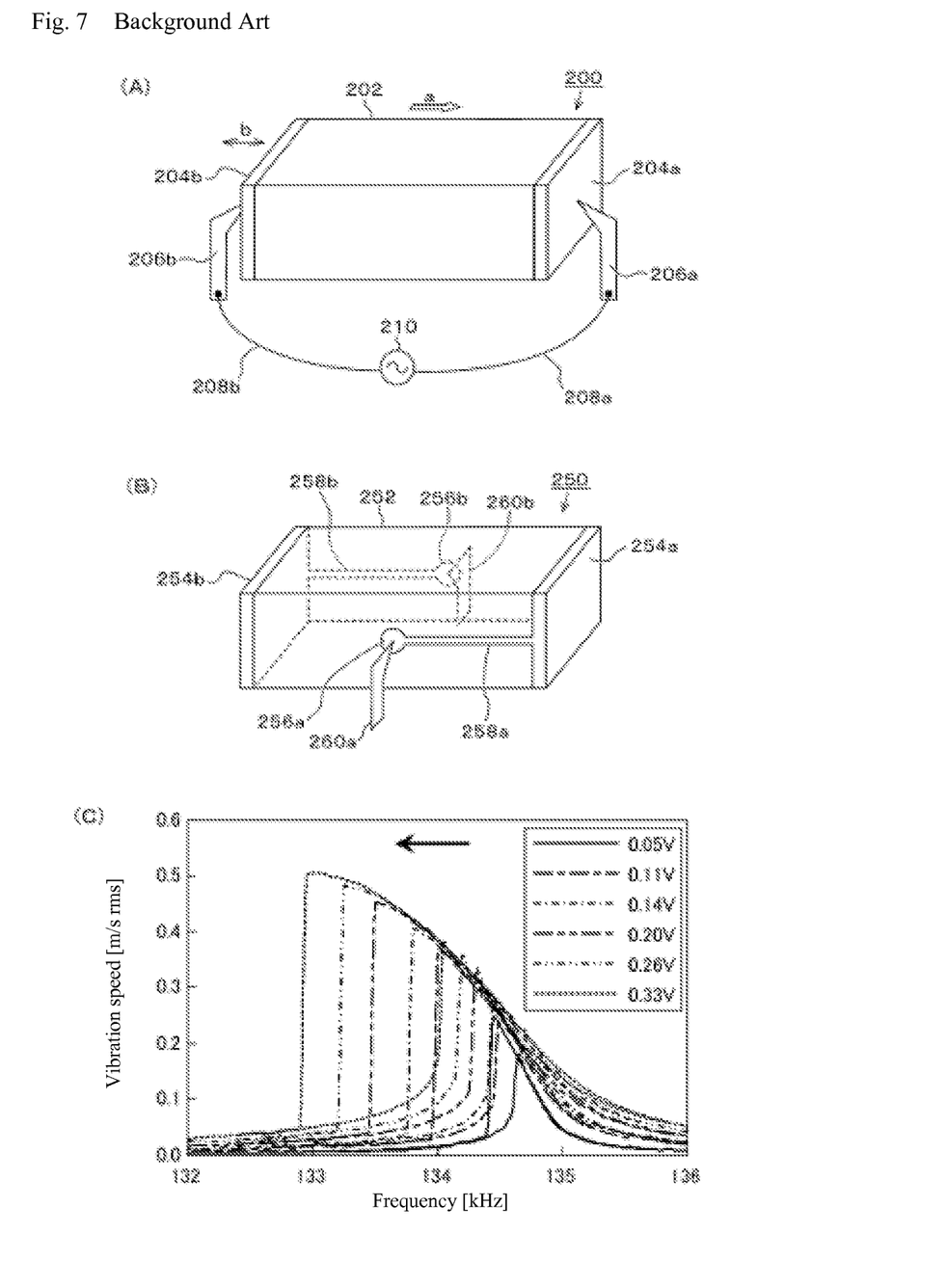
FIG. 7 Drawings showing background art, where (A) and (B) are exterior perspective views showing the constitutions of conventional resonant actuators, while (C) is a graph showing the relationship of vibration speed and frequency characteristics of a typical piezoelectric material (PZT) when driven under voltage.

Resonant actuators having the constitution shown in FIG. 7 (A) have been known. The resonant actuator 200 shown in FIG. 7 (A) is constituted by a piezoelectric ceramic material 202 formed in the shape of a square bar, with electrodes 204a, 204b provided on both end faces of the material. The resonant actuator 200 is polarized in the direction of arrow a and constituted in such a way that an AC electric field is applied to the electrodes 204a, 204b to drive the actuator at and near a resonance frequency so as to obtain vertical vibration in the direction of arrow b which is the same as the polarization direction a. Normally an AC electric field is applied to the electrodes 204a, 204b by connecting conductive wires 208a, 208b connected to an AC power supply, to the electrodes 204a, 204b, via spring terminals 206a, 206b, or by directly connecting the electrodes 204a, 204b to the conductive wires 208a, 208b.

Also, International Patent Laid-open No. 2008/090758 (Patent Literature 1) proposes the constitution shown in FIG. 7 (B) by considering possible inhibition, by the spring terminals 206a, 206b and conductive wires 208a, 208b, of the vibration of the resonant actuator 200. The constitution of the resonant actuator 250 shown in FIG. 7 (B) is to suppress inhibition of vibration by using lead conductors 258a, 258b to lead out electrodes 254a, 254b, provided on both end faces of a piezoelectric ceramic material 252 of square bar shape, to the centers of the side faces of the piezoelectric ceramic material 252, while pressing connection electrodes 256a, 256b using spring terminals 260a, 260b.

This type of resonant actuator is considered to be normally displaced, in the vibration direction, by an amount proportional to the piezoelectric constant d. In the field of ceramic materials for resonant actuators, therefore, active research and development efforts have been underway to obtain piezoelectric materials based on Pb(Zr,Ti)O3 (lead zirconate titanate (hereinafter referred to as "PZT")) having a high piezoelectric constant. For example, "Atsuden Zairyo no Shin Tenkai (New Development of Piezoelectric Materials)" by Sadayuki Takahashi, TIC Co., Ltd., New Ceramics Vol. 11, No. 8 (1998), pp. 29-34 (Non-patent Literature 1) describes the large amplitude characteristics of piezoelectric ceramics used for piezoelectric actuators and other power devices, utilizing the large amplitude elastic vibration of piezoelectric ceramics. Non-patent Literature 1 reports that, while theoretically the vibration speed (=vibration amplitude×frequency) changes in proportion to the applied electric field E, driving PZT piezoelectric ceramics at a resonance frequency will cause the vibration speed to gradually drop to and eventually below the theoretical value once the electric field intensity exceeds a certain level.

Also, "Haipawaa Zairyo no Hyoka (Evaluation of High-power Materials)" by Sadayuki Takahashi, TIC Co., Ltd., New Ceramics (1995), No. 6, pp. 17-21 (Non-patent Literature 2) reports that driving PZT piezoelectric ceramics at a resonance frequency will cause the resonance frequency fr and mechanical quality coefficient to drop once the vibration level exceeds a certain value. In addition, it is known that a resonant actuator using conventional PZT piezoelectric ceramics will see its resonance frequency and mechanical quality coefficient drop as the vibration speed rises. When AC voltages of 0.05 V, 0.11 V, 0.14 V, 0.20 V, 0.26 V and 0.33 V were actually applied to a resonant actuator of a PZT piezoelectric ceramic and the drive frequency was swept from above to below, and from below to above, a resonance frequency, the resonance frequency representing the maximum vibration speed was moved to a low frequency side as the amplitude of the AC electric field increased, as shown in FIG. 7 (C). The vibration speed did not return even when the frequency was lowered, and a hysteresis was observed.

This suggests a need for a feedback circuit to follow changes in the resonance frequency fr. In the field of piezoelectric actuators, etc., where high-power materials of high vibration levels are required, evaluation methods for piezoelectric property as well as relationships of compositions of PZT piezoelectric ceramics on one hand, and vibration level characteristics and other high-power characteristics on the other, are reported. To solve this problem, International Patent Laid-open No. 2007/083475 (Patent Literature 2) reports a resonant actuator constituted by a ceramic offering high mechanical quality coefficient, being highly temperature stable, and containing an oriented bismuth layered compound, by arguing the relationship of "Vibration speed α (Elastic constant)½×Piezoelectric constant×Mechanical quality coefficient×Electric field."

SUMMARY OF THE INVENTION

Problems to be Solved by the Invention

There is a problem, however, because bismuth layered compounds have low piezoelectric characteristics and thus a resonant actuator containing a bismuth layered compound will not be driven when a load is applied, as its mechanical quality coefficient will be reduced to a low level. Accordingly, it is desired that a piezoelectric ceramic having higher piezoelectric characteristics than the bismuth layered compound contained in it will still be driven stably at and near a resonance frequency by suppressing resonance frequency fluctuation, even when the AC electric field is raised to increase the vibration speed of the piezoelectric drive element.

Various embodiments of the present invention provide piezoelectric drive elements and piezoelectric drive units that are driven stably at and near a resonance frequency by suppressing resonance frequency fluctuation, even when the applied AC electric field is raised to increase the vibration speed of the piezoelectric drive element.

Means for Solving the Problems

A piezoelectric drive element pertaining to an embodiment of the present invention comprises: a composite ceramic that combines a first piezoelectric ceramic having soft spring characteristics such that its elastic constant decreases as the vibration speed increases, with a second piezoelectric ceramic having hard spring characteristics such that its elastic constant increases as the vibration speed increases; and external electrodes provided on the side faces of the composite ceramic in a manner facing each other across the composite ceramic; wherein an AC electric field at and near a resonance frequency is applied to the external electrodes to drive the piezoelectric drive element.

In an embodiment, the composite ceramic is constituted by a mixture of the first piezoelectric ceramic and second piezoelectric ceramic, or by a laminate of the first piezoelectric ceramic and second piezoelectric ceramic. In another embodiment, the composite ceramic is constituted by a laminate of the first piezoelectric ceramic and second piezoelectric ceramic shaped into a flat sheet, roll or concentric circle. In yet another embodiment, a laminate structure is produced by providing multiple internal electrodes, each connected to one of the external electrodes facing each other, in the composite ceramic. In yet another embodiment, the elastic constant of the composite ceramic is adjusted by the volume fraction of the first piezoelectric ceramic and second piezoelectric ceramic in order to suppress resonance frequency fluctuation relative to change in vibration speed.

In yet another embodiment, the first piezoelectric ceramic is a PZT-based lead piezoelectric ceramic, $BaTiO_3$, $(Ba_{1/2}Na_{1/2})TiO_3$, $(Ba_{1/2}K_{1/2})TiO_3$, $\{(K_{1-x}Na_x)_{1-y}Li_y\}(Nb_{1-z-w}Ta_zSb_w)O_3$ ($0 \leq x \leq 1, 0 \leq y \leq 0.2, 0 \leq z \leq 0.4, 0 \leq w \leq 0.2$), or a solid solution ceramic containing at least two of the foregoing, while the second piezoelectric ceramic is $Sr_{2-x}Ca_xNaNb_5O_{15}$ ($0 \leq x \leq 2$), $Sr_2NaNb_5O_{15}$, $Ca_2NaNb_5O_{15}$, $Sr_2KNb_5O_{15}$, $Ba_2LiNb_5O_{15}$, $Ba_2NaNb_5O_{15}$, $Ba_2KNb_5O_{15}$, $K_3Li_2Nb_5O_{15}$, $Ba_2Bi_{1/3}Nb_5O_{15}$, $Pb_2NaNb_5O_{15}$, $Pb_2KNb_5O_{15}$, or a solid solution ceramic of tungsten bronze type containing at least two of the foregoing.

Effects of the Invention

According to an embodiment of the present invention, an AC electric field is applied to a composite ceramic that combines a first piezoelectric ceramic having soft spring characteristics such that its elastic constant decreases as the vibration speed increases, with a second piezoelectric ceramic having hard spring characteristics such that its elastic constant increases as the vibration speed increases, through external electrodes provided in a manner facing each other across the composite ceramic, to demonstrate drive function. As a result, raising the AC electric field to increase the vibration speed of the piezoelectric drive element causes the elastic constant of the first piezoelectric ceramic part to drop and elastic constant of the second piezoelectric ceramic part to rise, thereby suppressing change in the elastic constant of the overall composite ceramic to suppress resonance frequency fluctuation and provide a piezoelectric drive element and piezoelectric drive unit that are driven stably at and near a resonance frequency.

MODE FOR CARRYING OUT THE INVENTION

Various embodiments are explained below in detail by referring to the drawings.

Example 1

Figure 1:
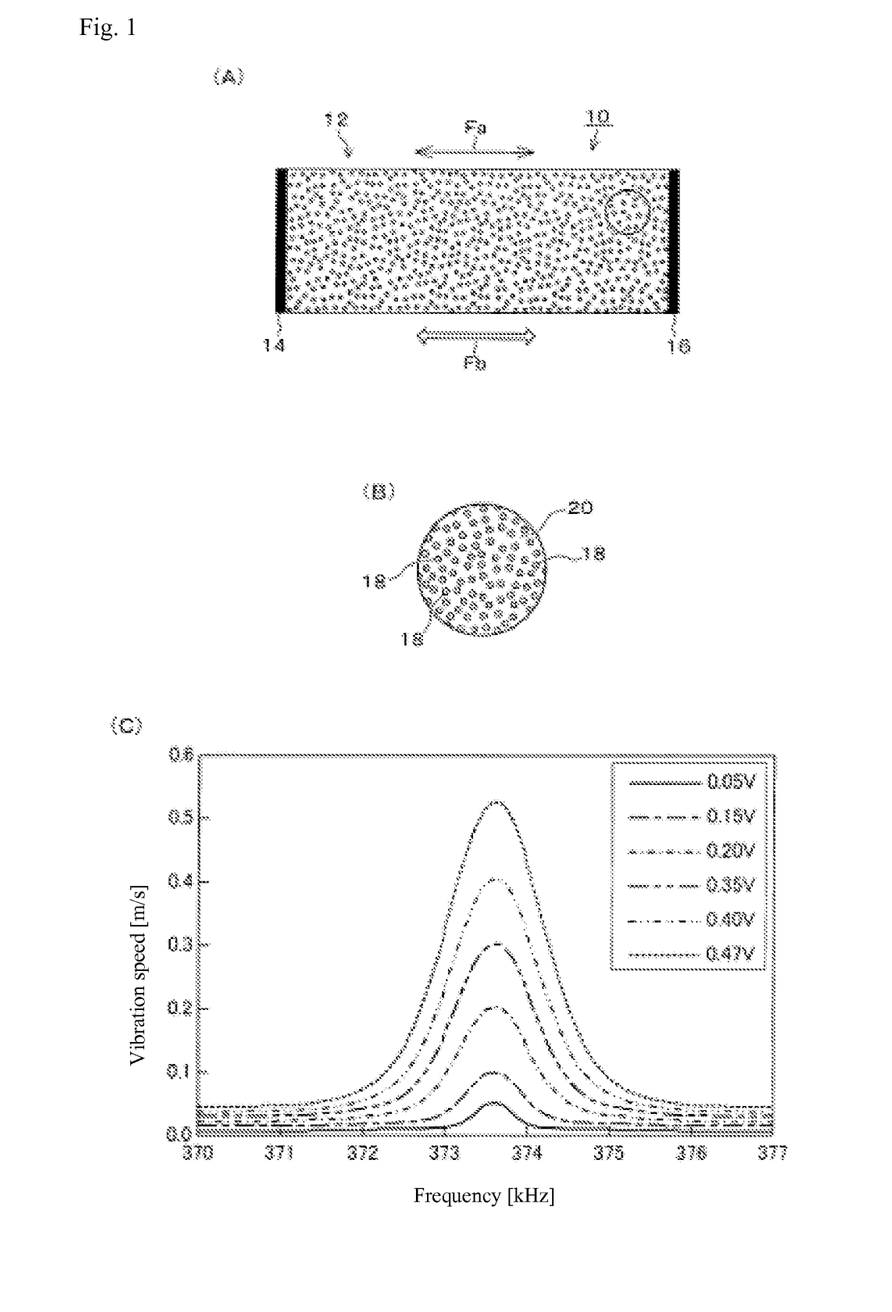
FIG. 1 Drawings showing Example 1 of the present invention, where (A) is a key section view showing the constitution of the piezoelectric drive element, (B) is a partially enlarged view of the composite ceramic in (A) above, and (C) is a graph showing the relationship of vibration speed and frequency characteristics in Example 1.
Figure 2:
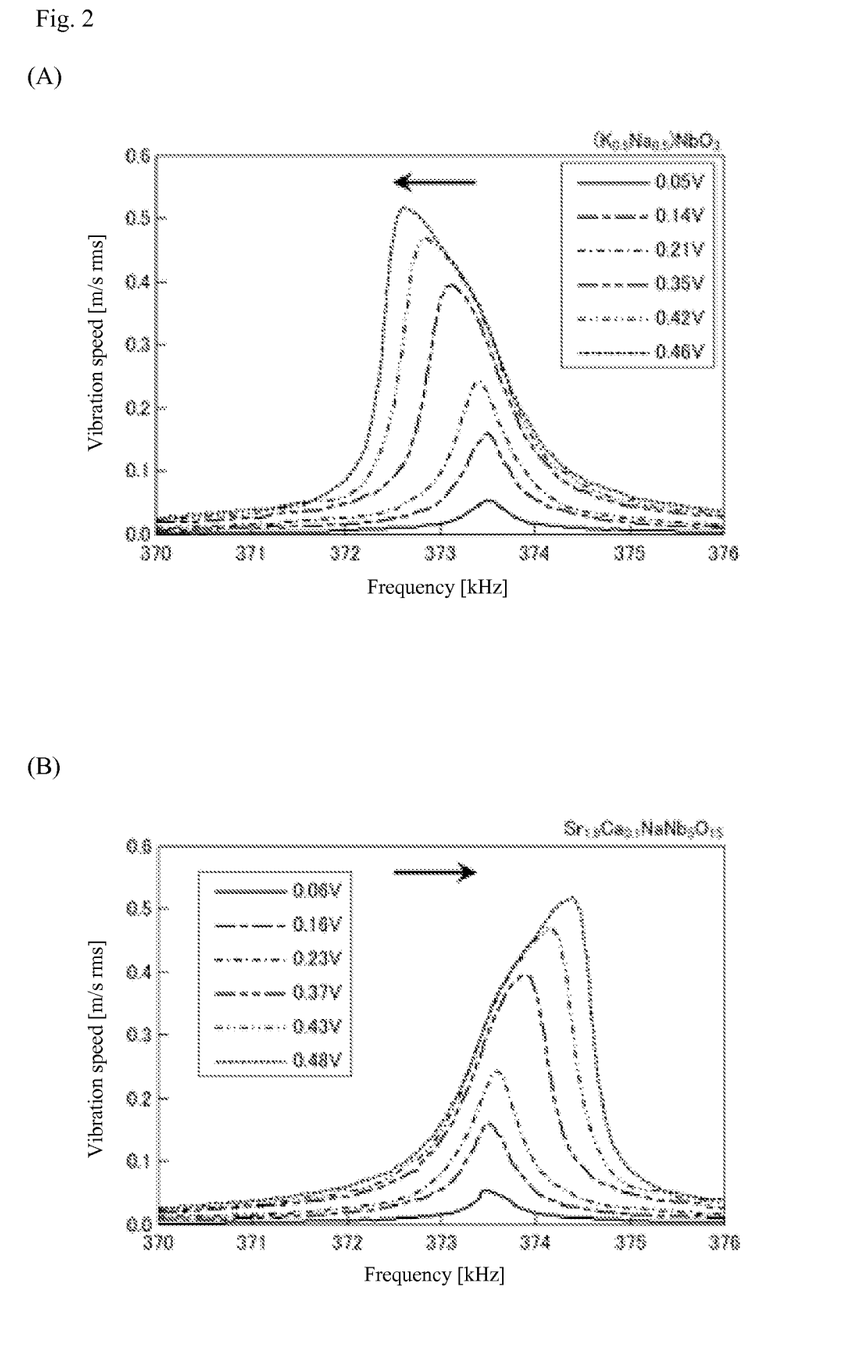
FIG. 2 Graphs showing the relationships of vibration speed and frequency characteristics of the piezoelectric drive elements in comparative examples to Example 1 above, where (A) shows the characteristics in Comparative Example 1 using a piezoelectric ceramic having soft spring characteristics, while (B) shows the characteristics in Comparative Example 2 using a piezoelectric ceramic having hard spring characteristics.

First, Example 1 of the present invention is explained by referring to FIGS. 1 and 2. FIG. 1 (A) is a key section view showing the constitution of the piezoelectric drive element in this example, FIG. 1 (B) is a partially enlarged view of the composite ceramic in (A) above, and FIG. 1 (C) is a graph showing the relationship of vibration speed and frequency characteristics in Example 1. FIG. 2 provides graphs showing the relationships of vibration speed and frequency characteristics of the piezoelectric drive elements in comparative examples, where (A) shows the characteristics in Comparative Example 1 using a piezoelectric ceramic having soft spring characteristics, while (B) shows the characteristics in Comparative Example 2 using a piezoelectric ceramic having hard spring characteristics.

As shown in FIG. 1 (A), a piezoelectric drive element 10 in this example comprises: a composite ceramic 12 of roughly rectangular solid shape that combines a first piezoelectric ceramic 18 having soft spring characteristics such that its elastic constant decreases as the vibration speed increases, with a second piezoelectric ceramic 20 having hard spring characteristics such that its elastic constant increases as the vibration speed increases; and external electrodes 14, 16 provided on the opposing side faces of the composite ceramic 12 of roughly rectangular solid shape in a manner crossing at right angles with the polarization direction (direction of arrow Fa in FIG. 1 (A)). In this example, the composite ceramic 12 is a mixture of powders of the first piezoelectric ceramic 18 and second piezoelectric ceramic 20 (refer to the partially enlarged view of FIG. 1 (B)). Then, an AC electric field at and near a resonance frequency is applied to the composite ceramic 12, via the external electrodes 14, 16, from an AC power supply not illustrated, to drive the piezoelectric drive element 10 in the direction indicated by arrow Fb.

The volume fraction of the first piezoelectric ceramic 18 and second piezoelectric ceramic 20 may be 1, but the volume fraction may be set to other value so as to suppress change in elastic modulus due to vibration speed (drive electric field) and also suppress resonance frequency fluctuation relative to vibration speed. Desirably, adjustment is such that resonance frequency fluctuation is 0.05% or less, for example. Also, the first piezoelectric ceramic 18 having soft spring characteristics is selected from a group that includes PZT-based lead piezoelectric ceramics, $BaTiO_3$, $(Ba_{1/2}Na_{1/2})TiO_3$, $(Ba_{1/2}K_{1/2})TiO_3$, and $\{(K_{1-x}Na_x)_{1-y}Li_y\}(Nb_{1-z-w}Ta_zSb_w)O_3$ ($0 \leq x \leq 1$, $0 \leq y \leq 0.2$, $0 \leq z \leq 0.4$, $0 \leq w \leq 0.2$), and solid solution ceramics containing at least two of the foregoing, for example. On the other hand, the second piezoelectric ceramic 20 having hard spring characteristics is selected from a group that includes $Sr_{2-x}Ca_xNaNb_5O_{15}$ ($0 \leq x \leq 2$), $Sr_2NaNb_5O_{15}$, $Ca_2NaNb_5O_{15}$, $Sr_2KNb_5O_{15}$, $Ba_2LiNb_5O_{15}$, $Ba_2NaNb_5O_{15}$, $Ba_2KNb_5O_{15}$, $K_3Li_2Nb_5O_{15}$, $Ba_2Bi_{1/3}Nb_5O_{15}$, $Pb_2NaNb_5O_{15}$, $Pb_2KNb_5O_{15}$, and solid solution ceramics of tungsten bronze type containing at least two of the foregoing, for example. For the external electrodes 14, 16, various known electrode materials, such as Ag, can be used.

Test Example 1

Next, specific examples of this example are explained further. A piezoelectric ceramic of $(K_{0.5},Na_{0.5})NbO_3$ was selected as the first piezoelectric ceramics 18 having soft spring characteristics, and a piezoelectric ceramic of $Sr_{1.9}Ca_{0.1}NaNb_5O_{15}$ was selected as the second piezoelectric ceramic 20 having hard spring characteristics. Powders of the respective piezoelectric ceramics were prepared by the solid phase synthesis method involving weighing of $K_2CO_3$, $Na_2CO_3$, $Nb_2O_5$, $SrCO_3$ and $CaCO_3$ to the stoichiometric compositions, followed by mixing and tentative sintering. To the prepared piezoelectric ceramics, 0.5 percent by weight of $Mn_2O$ was added to enhance their mechanical quality coefficients, respectively. Then, the obtained piezoelectric ceramic powders were weighed to an equal volume fraction, after which the weighed powders were mixed and the mixture was spark-plasma sintered at 1150° C. and then heat-treated in air at 900° C., to produce a composite ceramic.

Next, the composite ceramic 12 was processed to a prism shape and electrodes 14, 16 were formed on its side faces, as shown in FIG. 1 (A), and polarized at 100° C. and 4 kV/mm, to form a piezoelectric drive element 10 constituted by the composite ceramic 12. Ag was used for the electrodes 14, 16. Furthermore, as Comparative Example 1, a piezoelectric drive element was produced only with the piezoelectric ceramic of $(K_{0.5},Na_{0.5})NbO_3$ (a piezoelectric ceramic having soft spring characteristics), and as Comparative Example 2, a piezoelectric drive element was produced only with the piezoelectric ceramic of $Sr_{1.9}Ca_{0.1}NaNb_5O_{15}$ (a piezoelectric ceramic having hard spring characteristics). The same material used in Test Example 1 was used for the external electrodes provided on the end faces of the piezoelectric ceramics in Comparative Examples 1 and 2. The piezoelectric drive elements in Test Example 1, Comparative Example 1, and Comparative Example 2 above were driven at and near a resonance frequency to check their characteristics.

FIG. 2 (A) shows the results of vibration speed vs. frequency measurement by decreasing the frequency from above, to below, a resonance frequency, performed on the piezoelectric drive element constituted by the piezoelectric ceramic of $(K_{0.5},Na_{0.5})NbO_3$ in Comparative Example 1, by applying AC voltages of 0.05 V, 0.14 V, 0.21 V, 0.35 V, 0.42 V and 0.46 V. As is evident from the results in FIG. 2 (A), the piezoelectric drive element in Comparative Example 1 exhibited soft spring characteristics as the resonance frequency dropped when the applied AC electric field was raised to increase the vibration speed (amplitude) of the piezoelectric drive element.

FIG. 2 (B) shows the results of vibration speed vs. frequency measurement by increasing the frequency from below, to above, a resonance frequency, performed on the piezoelectric drive element constituted by the piezoelectric ceramic of $Sr_{1.9}Ca_{0.1}NaNb_5O_{15}$ in Comparative Example 2, by applying AC voltages of 0.06 V, 0.16 V, 0.23 V, 0.37 V, 0.43 V and 0.48 V. As is evident from the results in FIG. 2 (B), the piezoelectric drive element in Comparative Example 2 exhibited hard spring characteristics as the resonance frequency rose when the applied AC electric field was raised to increase the vibration speed (amplitude) of the piezoelectric drive element.

On the other hand, FIG. 1 (C) shows the results of vibration speed measurement at and near a resonance frequency, performed on the piezoelectric drive element in Test Example 1 produced by combining the piezoelectric ceramic of $(K_{0.5},Na_{0.5})NbO_3$ and piezoelectric ceramic of $Sr_{1.9}Ca_{0.1}NaNb_5O_{15}$, by applying AC voltages of 0.05 V, 0.15 V, 0.20 V, 0.35 V, 0.40 V and 0.47 V. As is evident from the results in FIG. 1 (C), change in the overall elastic constant of the composite ceramic 12 was suppressed in Test Example 1 because, when the applied AC electric field was raised to increase the vibration speed of the piezoelectric drive element 10, the elastic constant of the first piezoelectric ceramic 18 part having soft spring characteristics dropped, while the elastic constant of the second piezoelectric ceramic 20 part having hard spring characteristics rose. As a result, resonance frequency fluctuation was suppressed and the piezoelectric drive element 10 was driven stably at and near a resonance frequency. Similar effects were obtained from a piezoelectric drive element constituted by a composite ceramic, produced by hardening the mixture of a first piezoelectric ceramic powder and second piezoelectric ceramic powder with resin added to it, and then forming electrodes in the same way as in Test Example 1 above. In other words, similar effects were achieved by a non-sintered composite ceramic, as well.

In Test Example 1 above, a piezoelectric ceramic of $(K_{0.5},Na_{0.5})NbO_3$ was selected as the first piezoelectric ceramics 18 having soft spring characteristics, and a piezoelectric ceramic of $Sr_{1.9}Ca_{0.1}NaNb_5O_{15}$ was selected as the second piezoelectric ceramics 20 having hard spring characteristics. However, it was confirmed that similar results were achieved when a PZT-based lead piezoelectric ceramic, $BaTiO_3$, $(Ba_{1/2}Na_{1/2})TiO_3$, $(Ba_{1/2}K_{1/2})TiO_3$, $\{(K_{1-x}Na_x)_{1-y}Li_y\}(Nb_{1-z-w}Ta_zSb_w)O_3$ ($0 \leq x \leq 1$, $0 \leq y \leq 0.2$, $0 \leq z \leq 0.4$, $0 \leq w \leq 0.2$), or a solid solution ceramic containing at least two of the foregoing, was used as the first piezoelectric ceramic 18 and $Sr_{2-x}Ca_xNaNb_5O_{15}$ ($0 \leq x \leq 2$), $Sr_2NaNb_5O_{15}$, $Ca_2NaNb_5O_{15}$, $Sr_2KNb_5O_{15}$, $Ba_2LiNb_5O_{15}$, $Ba_2NaNb_5O_{15}$, $Ba_2KNb_5O_{15}$, $K_3Li_2Nb_5O_{15}$, $Ba_2Bi_{1/3}Nb_5O_{15}$, $Pb_2NaNb_5O_{15}$, $Pb_2KNb_5O_{15}$, or a solid solution ceramic of tungsten bronze type containing at least two of the foregoing (excluding $Sr_{1.9}Ca_{0.1}NaNb_5O_{15}$) was used as the second piezoelectric ceramics 20.

As explained above, Example 1 involves: a composite ceramic 12 that combines a first piezoelectric ceramic 18 having soft spring characteristics such that its elastic constant decreases as the vibration speed increases, with a second piezoelectric ceramic 20 having hard spring characteristics such that its elastic constant increases as the vibration speed increases; external electrodes provided thereon in a manner facing each other across the composite ceramic 12 crossing at right angles with the polarization direction; and applying an AC electric field via the external electrodes 14, 16 to drive the piezoelectric drive element 10. Therefore, change in the overall elastic constant of the composite ceramic 12 is suppressed because, when the applied AC electric field is raised to increase the vibration speed (or amplitude) of the piezoelectric drive element 10, the elastic constant of the piezoelectric ceramic 18 part drops, while the elastic constant of the piezoelectric ceramic 20 part rises. As a result, resonance frequency fluctuation is suppressed and the piezoelectric drive element 10 is driven stably at and near a resonance frequency.

Example 2

Figure 3:
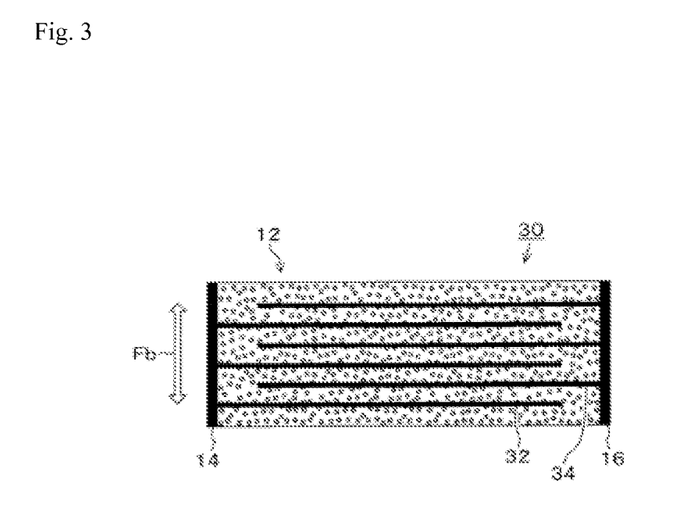
FIG. 3 Key section view showing the constitution of the piezoelectric drive element in Example 2 of the present invention.

Next, Example 2 of the present invention is explained by referring to FIG. 3. It should be noted that the same symbols are used to indicate constituents that are the same as or correspond to the matching constituents in Example 1 above (the same applies in the examples below). FIG. 3 is a key section view showing the constitution of the piezoelectric drive element in this example. A piezoelectric drive element 30 in this example has a laminate structure comprising multiple internal electrodes 32 connected to the external electrode 14 and multiple internal electrodes 34 connected to the external electrode 16, within the composite ceramic 12, with the internal electrodes placed alternately in the direction of crossing at right angles with the external electrodes 14, 16.

Test Example 2

Next, a specific example of this example is explained further. A piezoelectric ceramic of $(K_{0.5},Na_{0.5})NbO_3$ was selected as the first piezoelectric ceramic 18 having soft spring characteristics, and a piezoelectric ceramic of $Sr_{1.9}Ca_{0.1}NaNb_5O_{15}$ was selected as the second piezoelectric ceramic 20 having hard spring characteristics, and powders of the respective piezoelectric ceramics were prepared and mixed in the same manner as in Test Example 1 of Example 1 described above. The mixed powder was further mixed with organic solvent and organic binder and made into a slurry, which was then formed into sheets using the doctor blade method. Next, Ag—Pd internal electrodes were printed and then sintered to produce a composite piezoelectric ceramic of laminate structure, which was then processed into a prism shape and electrodes 14, 16 were formed on its side faces, after which polarization was performed in the same manner as in Test Example 1 described above, to form a piezoelectric drive element 30.

When frequency vs. vibration speed measurement was performed on the piezoelectric drive element 30 in Test Example 2 thus obtained by changing the AC electric field applied in the same manner as in Test Example 1 above, the resonance frequency representing the maximum vibration speed did not fluctuate even when the AC electric field was raised to increase the vibration speed, as is the case in FIG. 1 (C) above. Similar effects were also achieved by another piezoelectric element 30 having the laminate structure shown in FIG. 3 above, produced by adding resin to the mixture of the first piezoelectric ceramic powder and second piezoelectric ceramic powder and making it into sheets, and then forming internal electrodes using a conductive resin with Ag filler. In this example, too, piezoelectric ceramics other than those used in Test Example 2 can be selected as the first piezoelectric ceramic 18 and second piezoelectric ceramic 20, as mentioned in Example 1 above, and similar effects were actually achieved with such other piezoelectric ceramics.

Example 3

Figure 4:
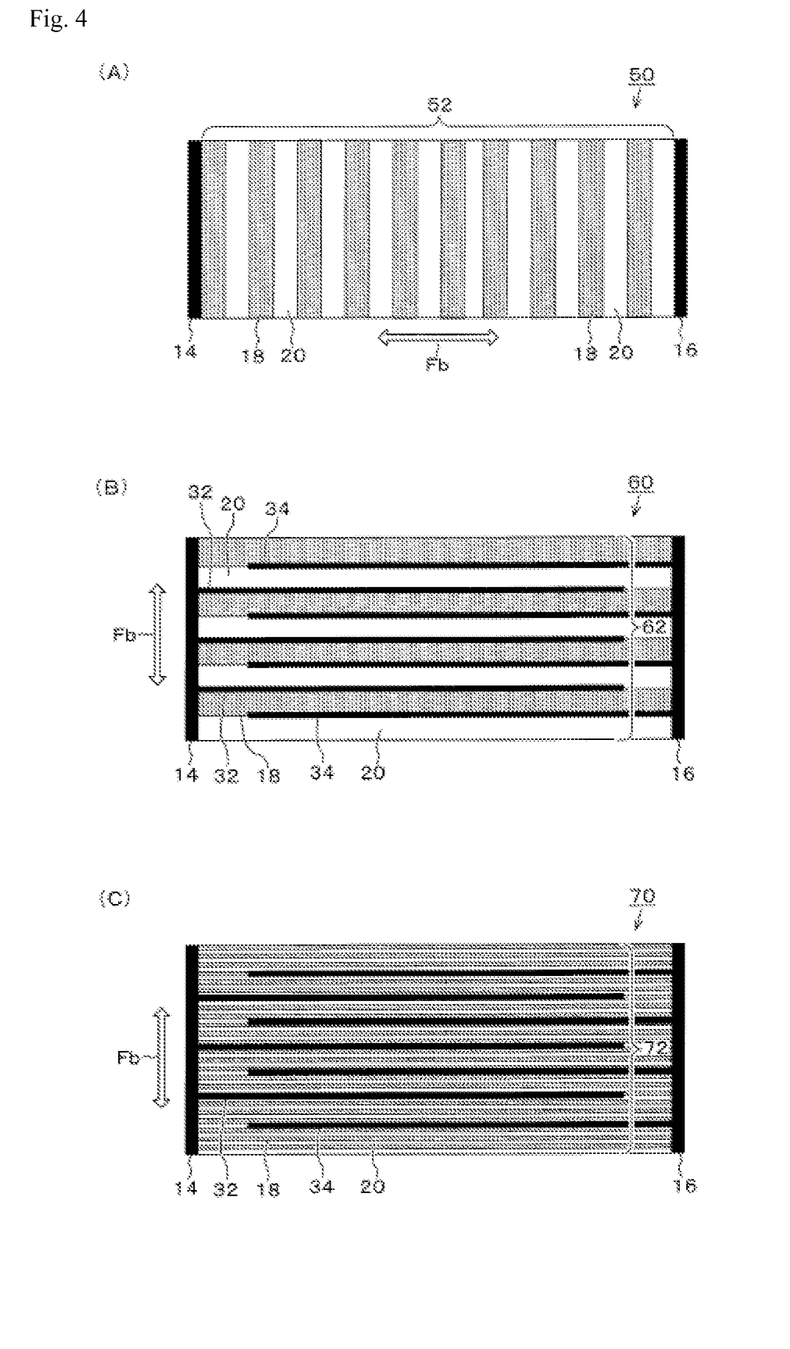
FIG. 4 Key section view showing the constitution of the piezoelectric drive element in Example 3 of the present invention.
Figure 5:
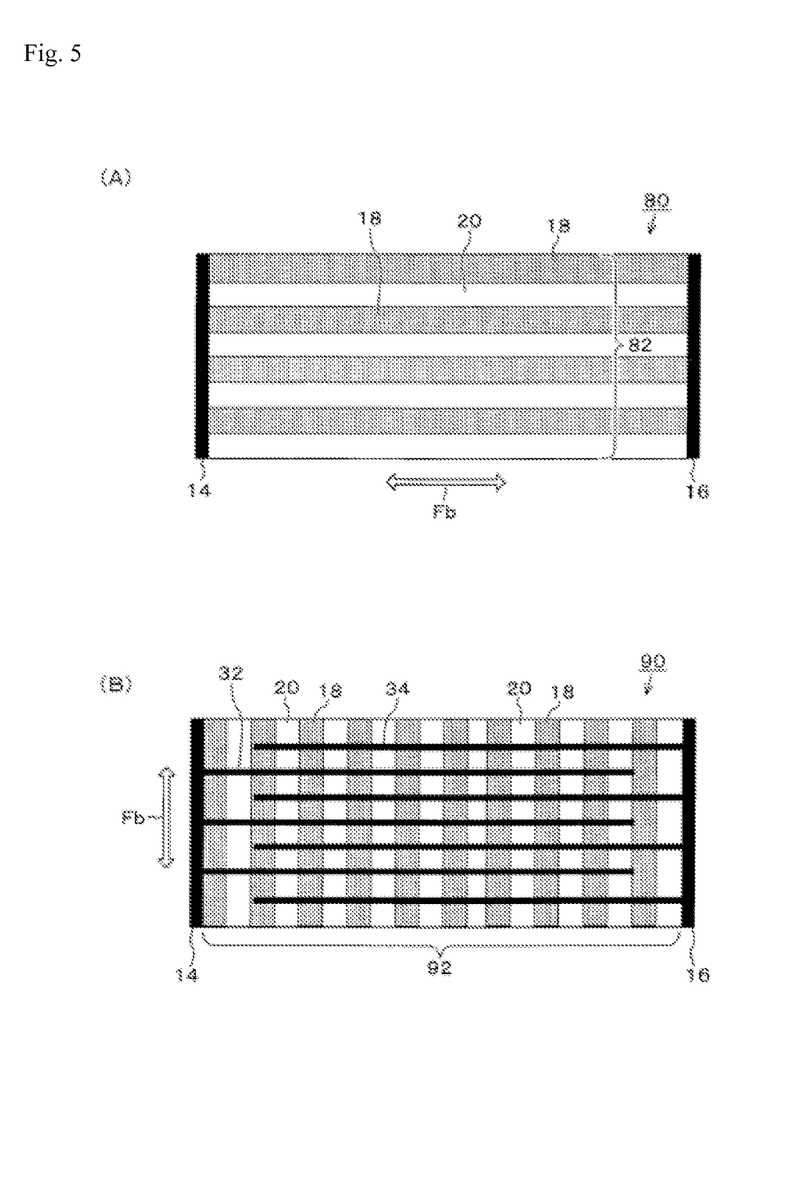
FIG. 5 Key section view showing the constitution of the piezoelectric drive element in another example of Example 3 above.

Next, Example 3 of the present invention is explained by referring to FIGS. 4 and 5. While Examples 1 and 2 above used a constitution based on mixing of a first piezoelectric ceramic 18 powder and a second piezoelectric ceramic 20 powder, it is also possible to adopt a constitution, as described in this example, where a first piezoelectric ceramic 18 and second piezoelectric ceramic 20 are both formed into sheets and layered alternately. First, with a piezoelectric drive element 50 in the example shown in FIG. 4 (A), a composite ceramic 52 has a constitution where a first piezoelectric ceramic 18 and second piezoelectric ceramic 20 are layered alternately in the polarization direction. The external electrodes 14, 16 are formed in parallel with these ceramic layers. The piezoelectric drive element 50 is driven in the direction of arrow Fb. Also, a piezoelectric drive element 60 in the example shown in FIG. 4 (B) has a constitution where first piezoelectric ceramic 18 layers and second piezoelectric ceramic 20 layers are arranged alternately in the direction crossing at right angles with the polarization direction, with multiple internal electrodes 32, 34 that connect to the external electrodes 14, 16 placed alternately between these first and second piezoelectric ceramic layers in the same manner as in Example 2 above, and is driven in the direction of arrow Fb. A piezoelectric drive element 70 shown in FIG. 4 (C) is a variation of the piezoelectric drive element 60 shown in FIG. 4 (B) above, where a composite ceramics 72 has a constitution where the internal electrodes 32, 34 are formed between laminates of first piezoelectric ceramic 18 and second piezoelectric ceramic 20. The piezoelectric drive element 70 is driven in the direction of arrow Fb. In all of these examples shown in FIGS. 4 (A) to (C), first piezoelectric ceramic 18 and second piezoelectric ceramic 20 are layered in the application direction of electric field.

Next, with a piezoelectric drive element 80 shown in FIG. 5 (A), a composite ceramic 82 is different from FIGS. 4 (A) to (C) above in that it is constituted by first piezoelectric ceramic 18 layers and second piezoelectric ceramic 20 layers alternately arranged in the direction crossing at right angles with the applied electric field. This piezoelectric drive element 80 is driven in the direction of arrow Fb. Furthermore, a piezoelectric drive element 90 shown in FIG. 5 (B) has a constitution where, in a composite ceramic 92 constituted by first piezoelectric ceramic 18 and second piezoelectric ceramic 20 layered in the same direction as in FIG. 4 (A) above, multiple internal electrodes 32, 34 are formed in a manner crossing at right angles with the lamination direction of the ceramic layers, so that first piezoelectric ceramic 18 and second piezoelectric ceramic 20 are layered in the direction crossing at right angles with the applied electric field.

Test Example 3

Next, a specific example of this example is explained further. A piezoelectric ceramic of $(K_{0.5},Na_{0.5})NbO_3$ was selected as the first piezoelectric ceramic 18 having soft spring characteristics, and a piezoelectric ceramic of $Sr_{1.9}Ca_{0.1}NaNb_5O_{15}$ was selected as the second piezoelectric ceramic 20 having hard spring characteristics, and powders of the respective piezoelectric ceramics were prepared and mixed in the same manner as in Test Example 1 of Example 1 described above. The mixed powder was further mixed with organic solvent and organic binder and made into a slurry, which was then formed into sheets using the doctor blade method. Next, the obtained piezoelectric ceramic sheets were used, by layering them, printing internal electrodes on them, and forming external electrodes on them as deemed appropriate, to form piezoelectric drive elements 50, 60, 70, 80 having the laminate structures shown in FIGS. 4 (A) to (C) and FIG. 5 (A), respectively. Also, sheets of (K0.5,Na0.5)

NbO3 were alternately layered with sheets of Sr1.9Ca0.1NaNb5O15, and then cut at a fixed pitch in the direction crossing at right angles with the lamination direction, and cut sheet laminates were layered again with internal electrodes 32, 34 printed on the cut faces, to produce a piezoelectric drive element 90 having the structure shown in FIG. 5 (B) above.

When frequency vs. vibration speed measurement was performed on these laminate piezoelectric drive elements 50, 60, 70, 80 and 90 by changing the AC electric field applied in the same manner as in Test Example 1 above, the resonance frequency representing the maximum vibration speed did not fluctuate like the results in FIG. 1 (C), even when the AC electric field was raised to increase the vibration speed. Similar effects were also achieved when piezoelectric drive elements 30 having the laminate structures shown in FIGS. 4 (A) to (C) and FIGS. 5 (A) and (B) were produced by adding resin to the mixture of the first piezoelectric ceramic powder and second piezoelectric ceramic powder and making the mixture into sheets, and then forming internal electrodes using a conductive resin with Ag filler. Again in this example, piezoelectric ceramics other than (K0.5,Na0.5)NbO3 and Sr1.9Ca0.1NaNb5O15 can be selected to achieve similar effects, as shown in Example 1 above.

It should be noted that the present invention is not limited to the examples mentioned above, and various changes can be made to the extent that they do not deviate from the key points of the present invention. For example, the present invention also includes the following:

(1) The shapes and dimensions indicated in Examples 1 to 3 above are only examples and can be changed as deemed appropriate if necessary. The same goes for the materials and, although the first piezoelectric ceramic 18 and second piezoelectric ceramic 20 are preferably selected from the groups of materials indicated in the above examples, any of the various known electrode materials can be used for internal electrodes and external electrodes.

Figure 6:
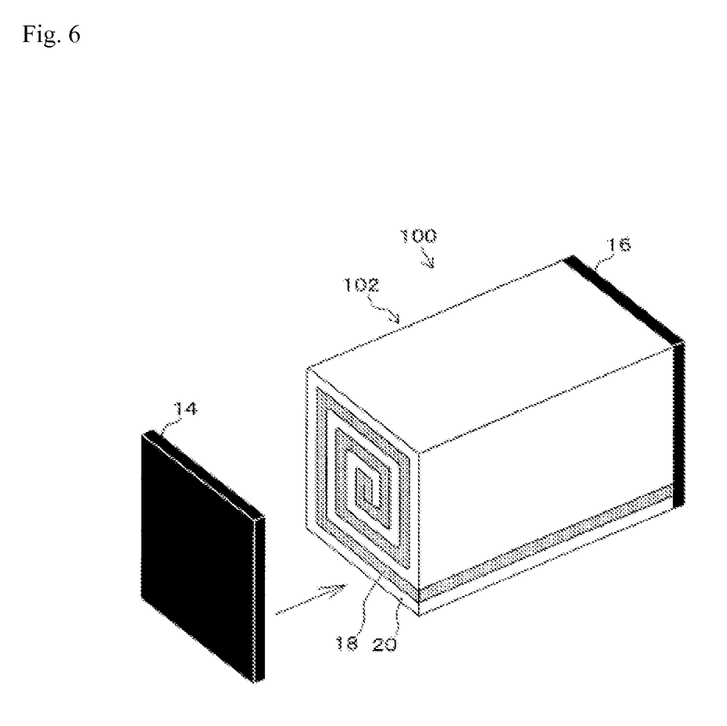
FIG. 6 Exterior perspective view showing the constitution of the piezoelectric drive element in another example of the present invention.

(2) In Example 3 above, the first piezoelectric ceramic 18 and second piezoelectric ceramic 20 were formed into flat sheets and laminated. However, this is also one example and the laminate structure encompasses various forms. For example, sheets of first piezoelectric ceramic 18 and second piezoelectric ceramic 20 can be layered and then spiraled (or rolled), with external electrodes 14, 16 provided on the end faces, like a composite ceramic 102 of a piezoelectric drive element 100 shown in FIG. 6. In this case, the outer shape of the composite ceramic 102 can be formed into roughly a rectangular solid shape, to facilitate subsequent mounting. Although the sheets are laminated by rolling in the example shown in FIG. 6, they can also be laminated in concentric circles.

(3) Although Example 1 above described a composite mode where the first piezoelectric ceramic 18 powder and second piezoelectric ceramic 20 powder were mixed, particle shapes of the powders can be changed as deemed appropriate to be amorphous, spherical, sheet-like, or fiber.

(4) The numbers of laminated internal electrode 32, 34 layers shown in Examples 2 and 3 above, and numbers of laminated first piezoelectric ceramic 18 layers and second piezoelectric ceramic 20 layers shown in Example 3, are also examples and can be increased or decreased as deemed appropriate as long as similar effects are achieved.

(5) The manufacturing methods of piezoelectric drive elements illustrated in the above examples are also examples and can be changed as deemed appropriate as long as similar effects are achieved.

(6) The piezoelectric drive elements in the various embodiments mentioned above can be favorably utilized for piezoelectric actuators, etc. However, they can also be applied to piezoelectric drive units used for various other known systems with a drive unit (such as camera lenses, projection lenses for overhead projectors, etc., binocular lenses, copier lenses and other lenses to be driven in optical systems; plotter, X-Y drive tables, and similar systems) and other systems with a drive unit in general. The piezoelectric drive elements in the various embodiments mentioned above are particularly suitable for systems that must be driven stably at and near a resonance frequency.

INDUSTRIAL FIELD OF APPLICATION

According to an embodiment of the present invention, an AC electric field is applied to a composite ceramic that combines a first piezoelectric ceramic having soft spring characteristics such that its elastic constant decreases as the vibration speed increases, with a second piezoelectric ceramic having hard spring characteristics such that its elastic constant increases as the vibration speed increases, via external electrodes provided thereon in a manner facing each other across the composite ceramic, to demonstrate drive function. Therefore, change in the overall elastic constant of the composite ceramic is suppressed because, when the applied AC electric field is raised to increase the vibration speed of the piezoelectric drive element, the elastic constant of the first piezoelectric ceramic part drops, while the elastic constant of the second piezoelectric ceramic part rises, and resonance frequency fluctuation is suppressed. As a result, the various embodiments mentioned above can be applied for piezoelectric drive elements and piezoelectric drive units that must be driven stably at and near a resonance frequency, particularly for supersonic motors.

DESCRIPTION OF THE SYMBOLS

10: Piezoelectric drive element
12: Composite ceramic
14, 16: External electrode
18: First piezoelectric ceramic
20: Second piezoelectric ceramic
30, 50, 60, 70, 80, 90, 100: Piezoelectric drive element
32, 34: Internal electrode
52, 62, 72, 82, 92, 102: Composite ceramic
200: Resonant actuator
202: Piezoelectric ceramic material
204a, 204b: Electrode
206a, 206b: Spring terminal
208a, 208b: Conductive wire
210: AC power supply
250: Resonant actuator
252: Piezoelectric ceramic material
254a, 254b: Electrode
256a, 256b: Connection electrode
258a, 258b: Lead conductor
260a, 260b: Spring terminal

What is claimed is:
1. A piezoelectric drive element, comprising:
a composite ceramic that combines a first piezoelectric ceramic having spring characteristics such that its elastic constant decreases as a vibration speed increases, with a second piezoelectric ceramic having spring characteristics such that its elastic constant increases as a vibration speed increases; and external electrodes provided on side faces of the complex ceramics in a manner facing each other across the complex ceramics;

wherein an AC electric field at and near a resonance frequency is applied to the external electrodes to drive the piezoelectric drive element, wherein the first piezoelectric ceramic is a PZT-based lead piezoelectric ceramic, $BaTiO_3$, $(Ba_{1/2}Na_{1/2})TiO_3$, $(Ba_{1/2}K_{1/2})TiO_3$, $\{(K_{1-x}Na_x)_{1-y}Li_y\}(Nb_{1-z-w}Ta_zSb_w)O_3$ ($0 \leq x \leq 1, 0 \leq y \leq 0.2, 0 \leq z \leq 0.4, 0 \leq w \leq 0.2$), or a solid solution ceramic containing at least two of the foregoing, while the second piezoelectric ceramic is $Sr_{2-x}Ca_xNaNb_5O_{15}$ ($0 \leq x \leq 2$), $Sr_2NaNb_5O_{15}$, $Ca_2NaNb_5O_{15}$, $Sr_2KNb_5O_{15}$, $Ba_2LiNb_5O_{15}$, $Ba_2NaNb_5O_{15}$, $Ba_2KNb_5O_{15}$, $K_3Li_2Nb_5O_{15}$, $Ba_2Bi_{1/3}Nb_5O_{15}$, $Pb_2NaNb_5O_{15}$, $Pb_2KNb_5O_{15}$, or a solid solution ceramic of tungsten bronze type containing at least two of the foregoing, wherein a volume fraction of the first piezoelectric ceramic and second piezoelectric ceramic is adjusted to suppress resonance frequency fluctuation relative to change in vibration speed.

2. A piezoelectric drive element according to claim 1, wherein the composite ceramic has a constitution where the first piezoelectric ceramic and second piezoelectric ceramic are mixed, or constitution where the first piezoelectric ceramic and second piezoelectric ceramic are layered together.

3. A piezoelectric drive element according to claim 2, wherein the composite ceramic has a constitution where the first piezoelectric ceramic and second piezoelectric ceramic are layered together in a shape of a flat sheet, roll or concentric circle.

4. A piezoelectric drive element according to claim 1, wherein multiple internal electrodes connected to one of the opposing external electrodes are provided in the composite ceramic to form a laminate structure.

5. A piezoelectric drive unit comprising a piezoelectric drive element according to claim 1.

* * * * *